United States Patent [19]

Hodes et al.

[11] 4,404,263
[45] Sep. 13, 1983

[54] LAMINATED BEARING MATERIAL AND PROCESS FOR MAKING THE SAME

[75] Inventors: Erich Hodes, Rosbach; Michael Steeg, Oberolm, both of Fed. Rep. of Germany

[73] Assignee: Glyco-Metall-Werke Daelen & Loos GmbH, Wiesbaden-Schierstein, Fed. Rep. of Germany

[21] Appl. No.: 312,110

[22] Filed: Oct. 16, 1981

Related U.S. Application Data

[63] Continuation-in-part of Ser. No. 102,011, Dec. 10, 1979, abandoned.

[30] Foreign Application Priority Data

Dec. 13, 1978 [DE] Fed. Rep. of Germany ....... 2853724
Apr. 11, 1979 [DE] Fed. Rep. of Germany ....... 2914618
Oct. 5, 1979 [DE] Fed. Rep. of Germany ....... 2940376

[51] Int. Cl.$^3$ .................. C23C 15/00; F16C 33/00
[52] U.S. Cl. ...................... 428/564; 428/626; 428/632; 204/192 C; 204/298; 308/DIG. 7; 308/DIG. 8; 308/DIG. 9
[58] Field of Search ............. 308/DIG. 7, DIG. 9, 308/DIG.8; 428/653, 551, 626, 624, 564, 565, 625, 632; 204/192 C, 192 SP, 298; 29/149.5 NM, 149.5 R; 75/140

[56] References Cited

U.S. PATENT DOCUMENTS

| | | | |
|---|---|---|---|
| 2,951,053 | 8/1960 | Reuter | 308/DIG. 7 |
| 2,977,673 | 4/1961 | Weinman | 428/677 |
| 3,416,941 | 12/1968 | Mizuno | 427/76.8 |
| 3,705,450 | 12/1972 | Morisaki | 428/564 |
| 3,864,093 | 2/1975 | Wolfla | 428/653 |
| 3,941,903 | 3/1976 | Tucker | 427/190 |
| 3,950,141 | 4/1976 | Roemer | 428/653 |
| 4,000,982 | 1/1977 | Veda | 29/182.3 |
| 4,013,830 | 3/1977 | Pinch | 204/192 F |
| 4,054,426 | 10/1977 | White | 204/192 SP |
| 4,140,592 | 2/1979 | Orlando | 204/56 R |
| 4,153,756 | 5/1979 | Iwahana | 75/140 |
| 4,189,525 | 2/1980 | Mori | 428/653 |
| 4,274,874 | 6/1981 | Obara | 308/DIG. 8 |

FOREIGN PATENT DOCUMENTS

| | | | |
|---|---|---|---|
| 623897 | 7/1961 | Canada | 29/192 R |
| 3856 | 9/1979 | European Pat. Off. | 428/626 |
| 1562286 | 4/1969 | France | 204/298 |
| 52-22512 | 2/1977 | Japan | 428/626 |
| WO79/00388 | 7/1979 | PTC Int'l Appl. | 308/DIG. 8 |
| 699032 | 12/1979 | U.S.S.R. | 204/298 |

Primary Examiner—L. Dewayne Rutledge
Assistant Examiner—J. J. Zimmerman
Attorney, Agent, or Firm—H. Gibner Lehmann; K. Gibner Lehmann

[57] ABSTRACT

Laminated anti-friction bearing material and process for producing the same. Heterogeneous wire, containing both metallic and non-metallic elements or components, is atomized by an electric current impulse discharge which causes an explosive or sputtering disintegration of the wire, resulting in the materials thereof being sprayed or deposited onto a substrate. The deposited coating can include a matrix formation in its make-up, with discrete anti-friction and other particles, and is characterized by a strong cohesion to the substrate, together with highly desirable sliding properties. The sputtering is accompanied by a controlled oxiding, or a controlled sulfidizing of the sputtered materials, and the sputtering can produce an improved anti-friction layer, and also an improved running-in layer.

39 Claims, 11 Drawing Figures

LAMINATED BEARING MATERIAL AND PROCESS FOR MAKING THE SAME

This application is a continuation-in-part of our copending application having the same title, filed Dec. 10, 1979 under Ser. No. 102,011, now about to become abandoned for lack of prosecution.

CROSS REFERENCES TO RELATED APPLICATIONS

1. Copending application of Erich Hodes and Danilo Sternisa Ser. No. 851,472 filed Nov. 14, 1977 and entitled Laminated Material And Method For Its Production By means Of Thermokinetic Plating.
2. Copending application of Erich Hodes, Danilo Sternisa and Walter Schneider Ser. No. 056,777 filed July 11, 1979 and entitled Laminated Bearing Material Comprising A Substrate Having A Metallic Suspension Alloy Coating, And Method For Producing The Same.

BACKGROUND

The invention relates to laminar material or sliding or friction elements with a sliding or friction layer, and according to the invention the said layers are applied to a support layer by an explosive wire process, or sputtering.

The use of an explosive wire process, in which a wire is atomized by current impulse discharge for coating the internal sliding surface of a cylinder, consisting of an aluminum alloy, of an internal combustion engine is known from German Auslegeschrift No. 2,521,286. It is also known to produce sliding layers from PTFE by sputtering (THIN SOLID FILMS, 3 (1969) 109 to 117—Elsevier, Lausanne).

However, with all of the known processes, a layer is built up virtually only from material of the same type by the explosive wire process or by sputtering.

SUMMARY

In contrast with prior practices, the object on which the invention is based is to provide laminar materials having sliding or friction layers, and also running-in layers, which are built up by sputtering but are considerably improved; such layers can also contain desired combinations of materials, including oxides and sulfides in controlled amounts.

This object is achieved, according to the invention, when the sliding or friction layer, or else the running-in layer consists of a firmly cohering coating of particles of diverse sliding or friction materials and, if desired, particles of additives which improve the sliding or friction and also the running-in characteristics, the said particles being sputtered on in a statistical sequence and distribution; and at least some of the sliding or friction materials combined in particle form in the sliding or friction, or running-in layer are not soluble in one another or not bondable with one another in the solid state.

On the one hand, the invention is based on the finding that sliding and friction materials of diverse types, and additives including oxides and sulfides which improve the sliding or friction characteristics, can be advantageously applied at the same time, and thus in a statistical sequence and distribution, by the explosive wire process and by sputtering, to a surface to be coated. On the other hand, the invention is based on the surprising finding that sliding and friction materials, and also the additives which improve the sliding and friction characteristics, which are jointly subjected to an explosive wire process or to sputtering are joined together so firmly when the corresponding particles are incorporated in a statistical sequence and distribution within a layer which is to be built up, and cohere so firmly, even when the sliding or friction layer built up is subjected to stress, that the sliding or friction layer produced is not only usable but, in respect of its bond strength to the surface of a substrate, is considerably improved.

A preferred application of the invention comprises the production of a sliding or friction layer which contains particles of one or more metallic sliding or friction materials with or without oxides and sulfides, which form a matrix, and particles of a plastic with sliding or friction properties, the said particles being sprayed on in a statistical sequence and distribution. According to the invention, such a plastic should have a dielectric constant with a maximum value of 2.6. Preferred examples of such plastics are PTFE and/or FEP and/or PVF (polyvinylfluoride) and/or PO (polyolefin).

Numerous attempts to apply anti-attrition additives, such as polytetrafluoroethylene (PTFE), to sliding or friction elements by sputtering have been disclosed (compare "THIN SOLID FILMS", 3, 1969, 109 to 113, Elsevier, Lausanne). However, all of these attempts relate to thin films of the additives themselves applied to a sliding layer, with the disadvantage that such films wear rapidly on starting and stopping a bearing, and the coefficient of friction of the bearing, which initially is low because of the anti-adhesive properties of the PTFE, rises again. It has also been attempted to embed particles of PTFE in a metallic matrix by means of electrochemical processes (compare British patent specification No. 1,032,899). However, fatigue strength tests have shown that, as a result of the internal notch effect of the PTFE particles, there is a reduction in the fatigue strength of such layers built up electrochemically, compared with that of pure metallic sliding layers. This can be explained by the fact that the PTFE particles incorporated are still too large-although they have dimensions of about 1 $\mu$m to 2 $\mu$m. In addition, because of the electrode-position processes employed, their distribution is very uneven. Metallographic ground cross-sections showed that there are areas with accumulations of coarse particles. All of these disadvantages are avoided or overcome when the process according to the invention is used for embedding the plastic particles in a metal matrix. By atomizing metallic substance and plastic at the same time, in particular with the aid of high-frequency sputtering, it was possible to obtain an exceptionally fine distribution of plastic particles, for example polytetrafluoroethylene particles, in a metallic matrix, for example a matrix consisting of an aluminum/tin alloy. The results achieved by this means were that not only is sufficient plastic acting as a solid lubricant, for example PTFE, available in the start-up and run-down phase of bearings, that is to say in an area of mixed friction, but also that the coefficient of friction in general is lowered and remains virtually constant when the bearing is in operation. Surprisingly, it has been found that a proportion of plastic of at most 20 percent by volume produces an optimum result. Moreover, it has been found that when a high-frequency sputtering process is used, the plastics which give the most uniform distribution in the metallic matrix are those which have a dielectric constant, according to DIN 53, 483 (50 Hz), which does not exceed a value of 2.6. These plastic substances are, for example, the thermoplastics listed below:

| Plastic | Dielectric constant according to DIN 53,483 (50 Hz) |
| --- | --- |
| Polytetrafluoroethylene | 2.1 |
| Tetrafluoroethylene/ Hexafluoropropylene | 2.1 |
| Polytrifluorochloroethylene | 2.3 |
| Ethylene/tetrafluoroethylene | 2.6 |
| Poly-4-methyl-pent-1-ene | 2.12 |
| Polypropylene | 2.25 |
| High-pressure polyethylene | 2.29 |
| Low-pressure polyethylene | 2.35 |

A further possibility for application of the invention comprises the provision of sliding or friction layers which contain particles of at least one metallic sliding or friction material, which forms a matrix, and of one or more ceramic materials with sliding or friction properties, the said particles being sprayed on in a statistical sequence and distribution. Composite materials of this type also are certainly of great importance for laminar material and sliding or friction elements and hitherto were not obtainable or were obtainable only with extremely great difficulty and only in limited quality. Finally, the invention can also be used to produce those sliding or friction layers which contain particles of diverse metallic sliding or friction materials which in the solid state are not soluble in one another, but at least one of which is suitable for forming a metallic matrix, the said particles being sprayed on in a statistical sequence and distribution. Sliding or friction layers which contain particles of an aluminum alloy based on AlPb or on AlSn and particles of lead and/or tin and/or a lead/tin alloy as the constituent forming a metallic matrix are a particular example. For example, the composition of a material of this type in the sliding or friction layer can essentially correspond to a AlSn:Cu ratio of 20:1 or to AlPb alloy. And the sputtered material can constitute not only the friction layer itself, but also a thin, running-in layer as well. The sputtered material can also advantageously include oxides and sulfides, in controlled amounts.

The laminar materials or sliding or friction elements according to the invention can also be considerably improved when the sliding or friction layer is formed as a dispersion-consolidated composite material and has substantially harder particles arranged in fine suspension in a matrix of metallic material; the harder particles are oxides of metallic constituents of the matrix incorporated in statu nascendi, during the explosive wire process or sputtering, in the matrix of the sliding or friction layer, and the metallic constitutents of the matrix chosen as those to be oxidized are those for which:

$$\frac{\text{volume of the oxide}}{\text{volume of the metal}} > 1.$$

Metallic sulfides can be incorporated in the matrix also, by the sputtering process. By this means, a considerably consolidated metallic matrix of the sliding or friction layer can be obtained for all of the possible applications mentioned above, and this is also useful in respect of the bedding and fixing of the particles of a different type which are incorporated in the matrix. The matrix can contain one or more conventional metals for sliding bearings or alloys for sliding bearings, for example an alloy which contains one or more of the metals from the group comprising aluminum, lead, cadmium, tin, zinc, nickel and copper. A preferred example is in a metallic matrix of an aluminum alloy, for example of an aluminum/tin suspension alloy which essentially contains 20% (by weight) of tin and 0 to 3% (by weight) of copper, the remainder being aluminum, with $Al_2O_3$ particles incorporated in fine suspension.

The sliding or friction layer can have a thickness of between about 0.005 mm and 0.050 mm and preferably of 0.010 mm to 0.030 mm.

The sliding or friction layer according to the invention can be applied direct to a support layer, for example a support layer of steel. However, it is also possible, in the case of laminar material or sliding or friction elements, to arrange an interlayer of material which has emergency running properties, for example lead bronze or tin bronze, between the support layer and the sliding or friction layer. In such a case, it is advisable to arrange a thin diffusion barrier layer of chromium or of a nickel/chromium alloy, especially a nickel/chromium alloy with a chromium content of about 20% (by weight), between the interlayer and the sliding or friction layer or the metallic matrix thereof. This diffusion barrier layer can also be applied by sputtering. And then, running-in layers can be advantageously produced by the sputtering process; metallic oxides and sulfides in controlled amounts can be produced by the sputtering, giving improved properties.

A process which is particularly suitable for the production of the laminar materials or sliding or friction elements according to the invention is characterized by the following steps:

The sliding or friction layer, or the running-in layer is formed by the explosive wire process, as by sputtering one or more targets; the target contains, or the targets contain, the sliding or friction material which forms the matrix of the sliding or the friction layer; and sliding or friction materials of a different type and/or materials which improve the sliding or friction characteristics are introduced beforehand, in the form of particles or pieces and in accordance with the admixture ratios desired in the sliding or friction layer, into the target or targets. Controlled atmospheres surround the parts, and can contribute oxides and/or sulfides to the layers.

For example, in the process according to the invention, bores can be made in a target moulded from one sliding or friction material, for sputtering, and slugs of the other sliding or friction material, or the other sliding or friction materials, and also lubricants and the like can be pressed into these bores, in accordance with the desired content by volume. This introduction of slugs into a target for sputtering is advisable, for example, if the target consists of a metallic sliding or friction material, for example of an aluminum alloy based on AlPb or on AlSn, and the slugs consist of a plastic which has sliding or friction properties and has a dielectric constant with a maximum value of 2.6, for example PTFE slugs. Another advantageous possible application of the target provided with slugs results if a target consists of an aluminum alloy, preferably based on AlPb or on AlSn, and the slugs consist of lead and/or tin and/or a lead/tin alloy.

When manufacturing the metallic targets provided with slugs, it has proved appropriate to manufacture such slugs by the hot isostatic compression moulding process, especially when the slugs consist of plastic. The slugs can be pressed in by, for example, dividing the target, which, for example, is a circular target, into 20 segments and pressing one slug, for example a plastic slug, which corresponds to the desired content by volume, into each of these segments.

Another possibility for a target which is made up in accordance with a desired ratio by volume in the sliding or friction layer to be produced comprises making up a target for sputtering, in accordance with the desired content by volume, of sectors of different sliding or friction materials and, if desired, additives which improve the sliding or friction characteristics, such as solid lubricants and the like. Finally, there is a possibility of manufacturing a target of this type by forming the target for the explosive wire process or sputtering by mixing particles of the desired sliding or friction materials and, if desired, additives which improve the sliding or friction characteristics, such as solid lubricants and the like, in the desired ratios by volume, and by compression moulding this mixture of particles. In order to ensure that wear on the diverse constituents contained in the target is as uniform as possible, it has proved particularly advantageous, within the framework of the invention, to apply the diverse materials at the same time and in the desired thickness from at least one target by high-frequency sputtering to a substrate, for example a layer of steel, in order to form the sliding or friction layer, or to a friction layer itself to form a thin, running-in layer. The ion density, and thus the uniformity of the atomization of the very diverse constituents, can be further improved by the use of magnetic cathodes for sputtering, especially high-frequency sputtering.

If it is desired to consolidate a metallic matrix, of the sliding or friction layer to be produced, by means of finely dispersed oxide particles, it is advisable, when manufacturing the target, or a target body which is also to be provided with slugs or other materials or is to be made up with other target parts, to use, as the starting material for the formation of a metallic matrix, a metallic sliding or friction material which is essentially free from oxides and for which:

$$\frac{\text{volume of the oxide}}{\text{volume of the metal}} > 1,$$

and to add gaseous oxygen in a controlled amount, corresponding to the desired oxide particle content of the sliding or friction layer to be produced, to the target or the targets or to one of the targets prior to the explosive wire process or prior to sputtering, and/or during the explosive wire process or sputtering to the plasma gas used for this. Argon can preferably be used as the plasma gas. Also, sulfides can be produced in the sputtered layer, by introducing hydrogen sulfide gas ($H_2S$) to the argon gas.

If it is desired to apply a tin-containing sliding or friction layer to a substrate with a copper-containing interlayer, it is possible first to apply a thin diffusion barrier layer to the copper-containing layer, by the explosive wire process or by sputtering, and then to apply the tin-containing sliding layer to the diffusion barrier layer by the explosive wire process or sputtering, with controlled admixture of oxygen and/or another reactive gas to the target or plasma gas. In this context, the manufacture of a diffusion barrier layer from chromium or a nickel/chromium alloy, for example an alloy with a chromium content of about 20% (by weight), can be considered as being particularly advantageous. The diffusion barrier layer and the sliding or friction layer can be applied directly after one another in the same plasma gas, but using different targets.

From the foregoing it can now be understood that objects of the invention include the provision of an improved bearing laminate formed by applying the slide layer thereof, or the running-in layer thereof, or both through the utilization of a sputtering process which results in discrete materials or particles being deposited in a finely divided state onto the substrate or barrier layer; the structural make-up of the slide layer can include a matrix and the materials can be both metallic and non-metallic so as to provide improved cohesion to the base structure while at the same time exhibiting highly desirable anti-friction qualities.

Illustrative embodiments of the invention are explained in more detail below, with the aid of the drawings.

Figure 1:
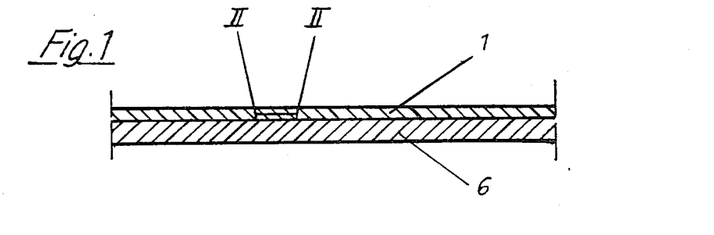
FIG. 1 shows an enlarged view of a section of a laminar material or a two-layer sliding bearing with a sliding layer according to the invention.
Figure 2:
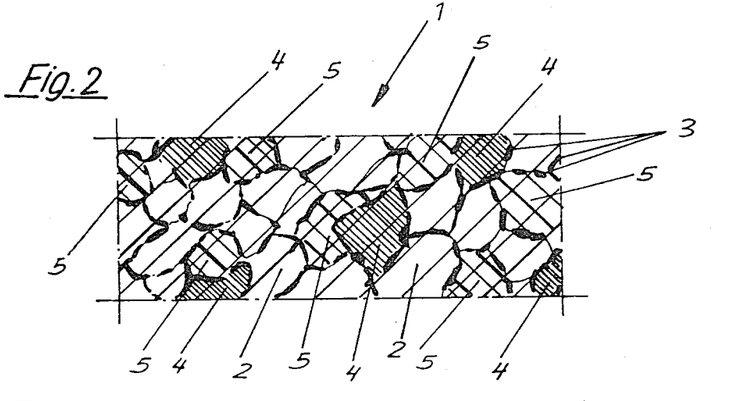
FIG. 2 shows a further greatly enlarged section II—II of the sliding layer according to FIG. 1.
Figure 5:
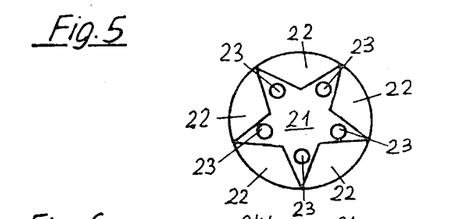
FIGS. 5 to 10 show a plan view of various embodiments of targets prepared.

In the example of FIGS. 1 and 2, a sliding layer 1 has been applied direct by sputtering to a steel backing 6. This sliding layer 1 contains, as shown, a matrix 2 of an aluminum/tin alloy which essentially contains 20% (by weight) of tin. In addition, copper could be provided in an amount of up to 3% (by weight). In the matrix 2, aluminum oxide particles 3 are arranged in fine distribution and in an amount of about 0.3% (by volume) and these have been incorporated in statu nascendi in this matrix during sputtering and, as a result of this, give rise to considerable dispersion-consolidation of the matrix 2. Furthermore, the sliding layer 1 contains PTFE particles 5 incorporated in the matrix and these act as additional solid lubricant. The conditions are similar in the case of a sliding layer 1 which consists of an aluminum/lead suspension alloy, that is to say an alloy in which aluminum particles and lead particles are present as separate particles and aluminum oxide particles are present in fine distribution in a small amount of less than 1% (by volume). The sliding layer 1 can, for example, be produced using a target, as is shown in FIG. 5 and is explained further below.

With 10-minute etching of the substrate and a sputtering period of 10 minutes in an argon atmosphere, approximately 10 μm thick layers of AlSn20Cu were obtained; these surprisingly have a Vickers pyramid hardness of 130, compared with which normal AlSn20Cu produced by continuous casting has a Vickers pyramid hardness of only 35. A remarkable stability of the sprayed-on layer when hot manifests itself in that the hardness astonishingly is still at its original level of a Vickers pyramid hardness of 130 even after a heat treatment for 100 hours at 170° C.—which leads to a considerable reduction in the hardness in the case of conventional sliding layers. Curiously, the bearing bushes produced in this way showed no measurable wear in tests on bearing testing machines after 250 hours under a load of 70 N/mm² and at a measured temperature at the back of the bearing of 160° C. Subsequent tests have shown that all of the conventional alloys for sliding bearings can be sputtered onto substrates suitable for sliding bearings in this way, as 5 to 50 μm thick sliding layers which have extremely improved properties with regard to strength, elevated temperature hardness and resistance to wear when hot. However, it has been found that this surprising advantage is essentially obtainable only when the metallic material to be oxidized, or the metallic component essentially to be oxidized, is such that:

$$\frac{\text{volume of the oxide}}{\text{volume of the metal}} > 1.$$

The table which follows indicates several such metallic materials and metallic alloy components, together with the oxides which can be used for dispersion-consolidation and the corresponding volume ratios.

| Metal | Oxide | Volume ratio |
| --- | --- | --- |
| Sodium | Na$_2$O | 0.32 |
| Potassium | K$_2$O | 0.51 |
| Strontium | SrO | 0.69 |
| Magnesium | MgO | 0.84 |
| Aluminum | Al$_2$O$_3$ | 1.46 |
| Lead | PbO | 1.31 |
| Cadmium | CdO | 1.32 |
| Tin | SnO$_2$ | 1.33 |
| Zinc | ZnO | 1.59 |
| Nickel | NiO | 1.68 |
| Nickel | Ni$_2$O$_3$ | 2.58 |
| Copper | Cu$_2$O | 1.67 |
| Copper | CuO | 1.75 |

As FIG. 2 shows, in the explosive wire process or during sputtering, oxide contained in small amounts in the target, and gaseous oxygen present at the target or contained in the plasma gas, is used to form extremely fine oxide particles 3. If another reactive gas is introduced with the plasma or argon gas, as for example H$_2$S, extremely fine sulfide particles would be formed, like the particles 3. These could be copper sulfide, or molybdenum sulfide particles, for example. During the explosive wire process or during sputtering, these oxide or sulfide particles 3 are then incorporated in the metallic matrix 2, of the sliding or friction layer 1, which is formed by this process.

Figure 3:
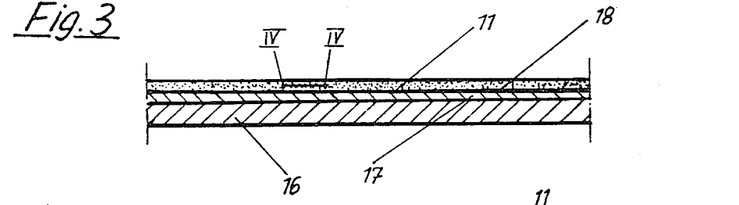
FIG. 3 shows an enlarged view of a section of a laminar material or a multi-layer sliding bearing with a dispersion-consolidated sliding layer according to the invention.
Figure 4:
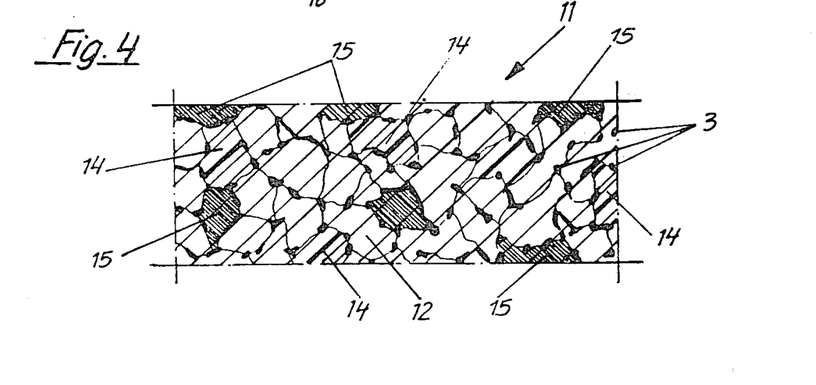
FIG. 4 shows a further greatly enlarged section IV—IV of the sliding layer according to FIG. 3.
Figure 8:
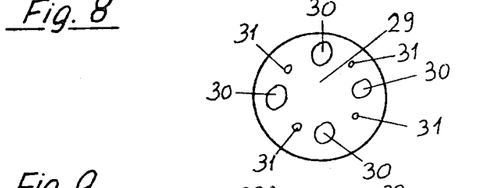

In the example of FIGS. 3 and 4, a multi-layer sliding bearing or a laminar material for the production of a multi-layer sliding bearing or a laminar material for the production of a multi-layer sliding bearing is shown in which a dispersion-consolidated sliding layer 11, according to the invention, has been applied by sputtering to a substrate which is formed from a steel backing 16, an interlayer 17 of an alloy for sliding bearings which has emergency running properties, for example CuPb22Sn, and a diffusion barrier 18 of a nickel/chromium alloy with a chromium content of 20% (by weight). In this example the sliding layer 11 contains a metal matrix of a white metal alloy for bearings, which is based on tin/lead. This matrix has been supplied to the diffusion barrier layer 18 by sputtering. Simultaneously with the application of the white metal matrix, finely divided, very small PTFE particles 14 were also incorporated in this matrix by the sputtering process. In addition, particles 15, which consist of molybdenum sulphide or boron nitride and improve the sliding characteristics, were incorporated in the sliding layer 11 during the sputtering process. These additional particles, which improve the sliding characteristics, have also been atomized from the same target as the PTFE particles 14 and the white metal particles forming the matrix 12, and incorporated in the sliding layer. The particles of three different types contained in the sliding layer 11 have, as a whole, been made to cohere firmly and reliably to one another by means of the sputtering process, so that the sliding layer is firmly coherent per se and, moreover, also adheres firmly to the surface of the diffusion barrier layer 18. In the example shown, the diffusion barrier layer 18 has been applied to the interlayer 17 by sputtering, immediately prior to the production of the sliding layer 11, and specifically has been applied in one and the same plasma as the sliding layer 11, but using a different target. The target to be used for the production of the sliding layer 11 can, for example, be made up as shown in FIG. 8.

FIG. 5 shows the cross-section of a target such as can be used, for example, in connection with the production of a sliding layer according to FIGS. 1 and 2. In its central region, this target has an aluminum core 21 with a star-shaped profile. Parts 22, made of tin or a tin/copper alloy, have been inserted between the rays of the star of the core piece 21 in order to fill up the interspaces between the rays of the star-shaped profile. Axial bores are provided inside the core piece 21, specifically in the region of the rays of the star, and these bores have been filled with slugs 23 of PTFE. The gaseous oxygen content of this target has been adjusted to the desired value by pre-treatment by the action of heat and in vacuo and with gaseous oxygen.

Figure 6:
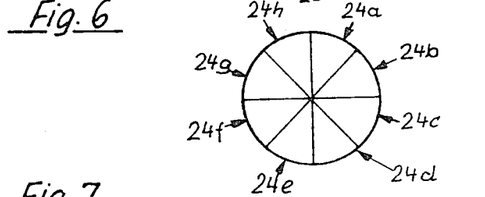

FIG. 6 shows the cross-section of a target in which a sector-pattern subdivision into sectors of different material has been carried out. FIG. 6, for example, shows eight sectors 24a to 24h. The width and the number of the sectors can be chosen in accordance with the desired composition of the finished layer.

Figure 7:
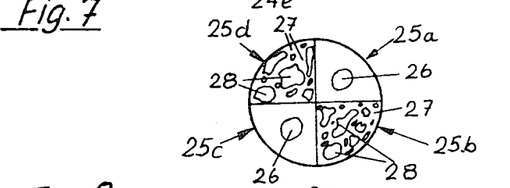

FIG. 7 shows the cross-section of a target which could likewise be used in combination with the production of a sliding layer according to FIGS. 1 and 2. In this target, four sectors 25a to 25d have been provided. In this example, the sectors 25a and 25c can consist of aluminum and each have an axial bore filled with a slug 26 of PTFE. The sectors 25b and 25d consist of a preformed aluminum/tin suspension alloy or aluminum/lead suspension alloy, and the matrix 27 is formed from aluminum and also incorporates more or less coarse particles 28 of tin or, respectively, lead.

As mentioned above, the target according to FIG. 8 is particularly suitable for the production of a sliding layer 11 according to FIGS. 3 and 4, for example a sliding layer consisting of CuPb22Sn with incorporated PTFE particles 14 and particles 15 of molybdenum sulfide or boron nitride. In order to combine these constituents, the target body 29 has four relatively large bores, which are filled with slugs 30 of PTFE, and four smaller axial bores are also provided, which hold slugs 31 of molybdenum sulfide.

Figure 9:
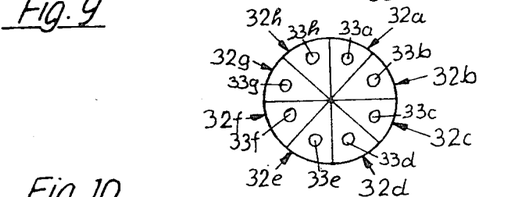

FIG. 9 shows a target which is made up in a similar way to the target according to FIG. 6. However, an axial bore is provided in each of the sectors 32a to 32h and each bore is filled with a slug 33a to 33h of the desired materials.

Figure 10:
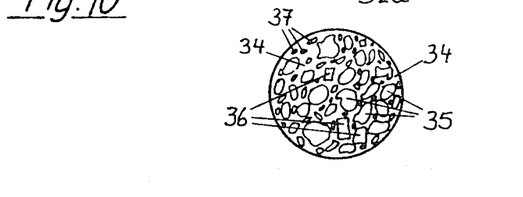

Finally, FIG. 10 shows a target in which the desired constituents of a sliding or friction layer are contained in a conglomerate-like manner in a matrix 34. This matrix can, for example, be a plastic containing polyimide or the like. The matrix contains metallic particles 35, for example lead particles, PTFE particles 36 and particles of substances which improve the sliding or friction characteristics, such as molybdenum disulphide, graphite or the like.

As in the example of FIG. 5, the oxygen contents of the targets according to FIGS. 6 to 10 can be adjusted so that the targets are either virtually free from oxygen or have a desired content of gaseous oxygen, or of other reactive gas such as $H_2S$.

Figure 11:
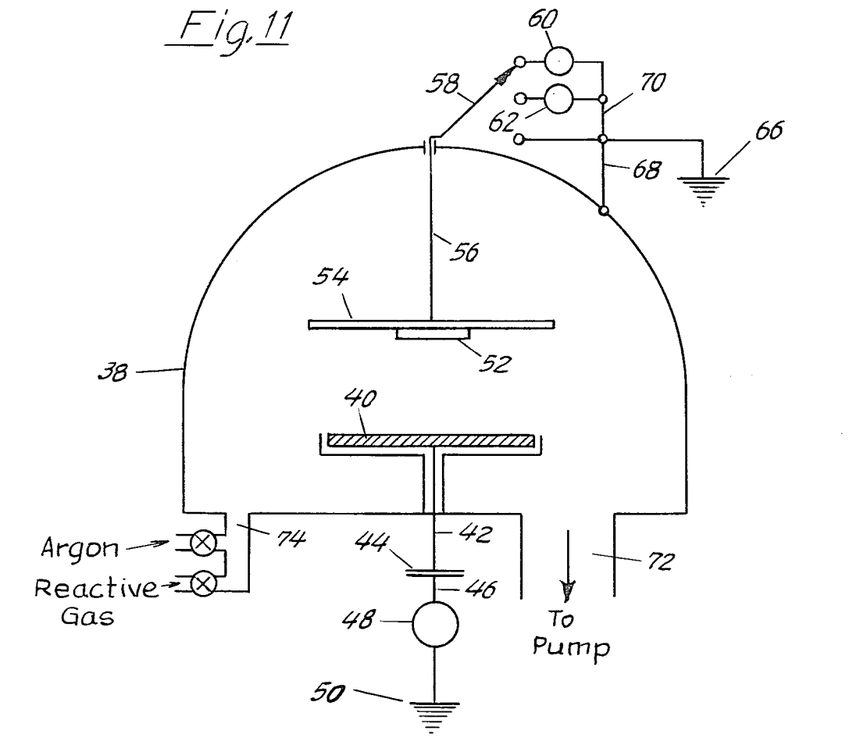
FIG. 11 is a diagrammatic representation of a sputtering apparatus suitable for carrying out the invention.

FIG. 11 depicts schematically an apparatus for carrying out the invention. A housing 38 encloses a target 40 which is electrically insulated from the housing and connected by a lead 42 to an impulse discharge device, such as an accumulator or capacitor 44 which in turn is connected by a lead to a high tension, high frequency generator 48 that has a terminal grounded at 50.

Spaced from the target 40 is a substrate member 52 carried by a holder 54 that has a lead 56 which is brought out through insulation to a switch arm 58. The arm 58 optionally connects with booster generators 60, 62 or else with a ground contact 64 that goes to a ground 66. The housing 38 is connected to the ground 66 by a lead 68, and the ground 66 connects to the generators 60, 62 by a lead 70.

The housing has a fluid outlet 72 for connection to an exhaust pump (not shown), and has an inlet 74 which can receive argon or another inert gas, and also a reactive gas such as oxygen or hydrogen sulfide in controlled amounts.

The spark discharge occurs between the target 40 and the substrate 52, and the plasma flow and deposited layer can include not only the materials from the target 40 but also oxides and/or sulfides due to the introduction of the gases at the inlet 74.

The contact arm 58 can be switched to either include or else exclude the booster generators 60, 62 as will be understood.

Priority is claimed herewith, under 35 USC 119, based on German Application No. P 28 53 724.8 filed Dec. 13, 1978; German Application No. P 29 14 618.7 filed Apr. 11, 1979; and German Application No. P 29 40 376.7 filed Oct. 5, 1979.

It will now be understood from the foregoing that we have provided an improved laminated bearing stock having a substrate structure and a sputtered facing layer that contains anti-friction material, together with means effected by a sputtering of the materials of the facing layer against said substrate structure, bonding and cohering the said facing layer thereto, said facing layer being constituted of diverse substances at least some of which are not soluble in one another in the solid state.

We claim:

1. Laminated bearing stock comprising, in combination:
 (a) a substrate structure;
 (b) a facing layer of material containing a matrix of antifriction substance which is sputtered by electrical discharge from a single, composite metallic target in a gas onto the said substrate structure,
 (c) said matrix including particles of oxides of at least one metal,
 (d) said particles being disposed in a fine suspension and constituting less than 1% by volume of said matrix substance,
 (e) said selected metal and said oxide thereof being such that the volume of the oxide is greater than the volume of the respective metal,
 (f) said facing layer also containing particles of at least one plastic substance having anti-friction properties, held in said matrix,
 (g) said plastic substance having a dielectric constant of at most 2.6, and,
 (h) means effected by said sputtering of the material of the facing layer against said substrate structure, for bonding and cohering the said facing layer thereto.

2. Laminated bearing stock as set forth in claim 1, wherein:
 (a) the facing layer contains particles of PTFE.

3. Laminated bearing stock as set forth in claim 1, wherein:
 (a) the facing layer contains particles of FEP.

4. Laminated bearing stock as set forth in claim 1, wherein:
 (a) the facing layer contains particles of PVF (polyvinylfluoride).

5. Laminated bearing stock as set forth in claim 1, wherein:
 (a) the facing layer contains particles of PO (polyolefin).

6. Laminated bearing stock as set forth in claim 1, wherein:
 (a) the facing layer contains plastic particles in an amount of at most about 20% by volume.

7. Laminated bearing stock as set forth in claim 1, wherein:
 (a) the facing layer contains a metallic matrix of friction substances,
 (b) said facing layer also containing particles of ceramic substance having anti-friction properties, held in said matrix.

8. Laminated bearing stock as set forth in claim 1, wherein:
 (a) the facing layer contains particles of diverse metallic substances, and particles of diverse anti-friction substances,
 (b) said facing layer having a metallic matrix formed of some of said particles,
 (c) said matrix containing the particles of diverse anti-friction substances.

9. Laminated bearing stock as set forth in claim 8, wherein:
 (a) the facing layer has particles containing aluminum and lead, which form the metallic matrix.

10. Laminated bearing stock as set forth in claim 8, wherein:
 (a) the facing layer has particles containing aluminum and tin, which form the metallic matrix.

11. Laminated bearing stock as set forth in claim 8, wherein:
 (a) the facing layer has approximately 20% Sn, 1% Cu with the rest constituted of aluminum-containing substance.

12. Laminated bearing stock as set forth in claim 1, wherein:
 (a) the facing layer contains a metallic matrix of the slidebearing alloys formed from the group which includes aluminum, tin, zinc, nickel and copper.

13. Laminated bearing stock as set forth in claim 1, wherein:

(a) the facing layer comprises an aluminum/tin suspension alloy containing essentially 20% (by weight) of tin, and from 0% to 3% (by weight) of copper with the remainder being aluminum, (b) said facing layer having harder particles in the form of aluminum oxides, incorporated as a fine suspension.

14. Laminated bearing stock as set forth in claim 1, wherein:

(a) the facing layer has a thickness of between about 0.005 mm and 0.050 mm.

15. Laminated bearing stock as set forth in claim 1, wherein:

(a) the substrate structure is steel with an interlayer surfacing of bronze metal that has a sputtered diffusion barrier layer containing chromium, which underlies the facing layer.

16. The process for the manufacture of laminated bearing stock constituted of a substrate structure and a sputtered facing layer on the substrate structure which includes the steps of:

(a) forming a multi-substance unitary target which contains antifriction metals, (b) providing in said target at least one metallic material for which the oxide of said metal has greater volume than the said metal itself, (c) said facing layer also containing particles of at least one plastic substance having anti-friction properties, held in said matrix, (d) said plastic substance having a dielectric constant of at most 2.6, (e) disposing the said target and the said substrate structure in proximity to each other in a gaseous atmosphere, (f) sputtering the substances of the target onto said substrate structure by an electrical discharge in said gaseous atmosphere, and (e) maintaining a selected low proportion oxygen content within said gaseous atmosphere during said sputtering.

17. The process for the manufacture of laminated bearing stock according to claim 16, wherein the forming of the target consists of molding a target form of one substance, and adding to the target form another substance which includes solid lubricants.

18. The process for the manufacture of laminated bearing stock as set forth in claim 17, wherein said one substance, which is molded, is metallic, and said other substance is a plastic having anti-friction qualities and a dielectric constant of not more than 2.6.

19. The process for the manufacture of laminated bearing stock as set forth in claim 17, wherein said one substance, which is molded, comprises an aluminum alloy, and the said other substance is a metal, or metals, selected from the group lead and tin.

20. The process for the manufacture of laminated bearing stock as set forth in claim 16, wherein the target is a wire formed of sectors of different friction materials some of which include solid lubricants.

21. The process for the manufacture of laminated bearing stock as set forth in claim 16, wherein the target is compression molded of a mixture of said metals and substances.

22. The process for the manufacture of laminated bearing stock as set forth in claim 16, wherein the step of sputtering comprises subjecting the target to high-frequency electrical currents.

23. The process for the manufacture of laminated bearing stock as set forth in claim 16, and including the further step of electrically polarizing the target.

24. The process for the manufacture of laminated bearing stock as set forth in claim 16, wherein the target includes metal which is essentially free of oxides, said metal when oxidized forming a substance in which:

$$\frac{\text{volume of the oxide}}{\text{volume of the metal}} > 1,$$

and wherein there is the further step of adding gaseous oxygen during the sputtering to effect oxidation of the said metal.

25. The process for the manufacture of laminated bearing stock as set forth in claim 16, wherein:

(a) the sputtering is done in an atmosphere of controlled gas, and (b) the anti-friction metals are selected from the group which includes aluminum, lead, cadmium, tin, zinc, nickel, and copper, (c) said forming of the target utilizing a casting process.

26. The process for the manufacture of laminated bearing stock as set forth in claim 16, wherein:

(a) the sputtering is done in an atmosphere of controlled gas, and (b) the target is subjected to a combined vacuum/heat treatment prior to the sputtering.

27. The process for the manufacture of laminated bearing stock as set forth in claim 16, wherein:

(a) the sputtering is done in an atmosphere of controlled gas which contains oxygen, and (b) the target is subjected to heat to de-gas it prior to the sputtering.

28. The process for the manufacture of laminated bearing stock as set forth in claim 26, wherein:

(a) the atmosphere of controlled gas comprises argon.

29. The process for the manufacture of laminated bearing stock as set forth in claim 16, wherein:

(a) the said sputtering step is preceded by sputtering onto the substrate structure a diffusion barrier layer of metal.

30. The process for the manufacture of laminated bearing stock as set forth in claim 29, wherein:

(a) the diffusion barrier layer comprises a nickel/chromium alloy.

31. The process for the manufacture of laminated bearing stock as set forth in claim 30, wherein:

(a) the chromium alloy is about 20% by weight.

32. The process for the manufacture of laminated bearing stock as set forth in claim 29, wherein:

(a) the diffusion barrier layer comprises virtually pure chromium.

33. The process for the manufacture of laminated bearing stock as set forth in claim 29, wherein:

(a) a separate target is used in applying the diffusion barrier layer, (b) both sputtering steps being carried out in the same atmosphere of controlled gas.

34. Laminated bearing stock comprising, in combination:

(a) a substrate structure, (b) a facing layer of material containing a matrix of anti-friction substance which is sputtered by electrical discharge from a single composite metallic target in a gas onto the said substrate structure, (c) said matrix including particles of sulfides of at least one metal, (d) said particles being disposed in a fine suspension and constituting less than 1% by volume of said matrix substance, (e) said selected metal and said sulfide thereof being such that the volume of the sulfide is greater than the volume of the respective metal, (f) said facing layer also containing particles of at least one plastic substance having anti-friction properties, held in said matrix, (g) said plastic substance having a dielectric constant of at most 2.6, and, (h) means effected by said sputtering of the material of the facing layer against said substrate structure, for bonding and cohering the said facing layer thereto.

35. The process for the manufacturing of laminated bearing stock constituted of a substrate structure and a sputtered facing layer on the substrate structure which includes the steps of:

(a) forming a multi-substance unitary target which contains anti-friction metals, (b) providing in said target at least one metallic material for which the sulfide of said metal has greater volume than the said metal itself, (c) said facing layer also containing particles of at least one plastic substance having anti-friction properties, held in said matrix, (d) said plastic substance having a dielectric constant of at most 2.6, (e) disposing the said target and the said substrate structure in proximity to each other in a gaseous atmosphere containing a sulphur compound, (f) sputtering the substances of the target onto said substrate structure by an electrical discharge in said gaseous atmosphere, and (g) maintaining a selected low proportion sulfide content within said gaseous atmosphere during said sputtering.

36. Laminated bearing stock as set forth in claim 1, and further including:

(a) a running-in layer sputtered on said facing layer (b) said running-in layer containing a sulfide of a metal.

37. Laminated bearing stock as set forth in claim 36, wherein:

(a) the sulfide of the running-in layer is copper sulfide.

38. Laminated bearing stock as set forth in claim 36, wherein:

(a) the sulfide of the running-in layer is molybdenum sulfide.

39. The process of claim 35, wherein:

(a) the sulphur compound in the gaseous atmosphere is hydrogen sulfide.

* * * * *